(12) United States Patent
Karasawa et al.

(10) Patent No.: US 10,295,907 B2
(45) Date of Patent: May 21, 2019

(54) RESIST UNDERLAYER FILM-FORMING COMPOSITION FOR LITHOGRAPHY CONTAINING POLYMER HAVING ACRYLAMIDE STRUCTURE AND ACRYLIC ACID ESTER STRUCTURE

(71) Applicant: NISSAN CHEMICAL INDUSTRIES, LTD., Tokyo (JP)

(72) Inventors: Ryo Karasawa, Toyama (JP); Yasunobu Someya, Toyama (JP); Takafumi Endo, Toyama (JP); Tokio Nishita, Toyama (JP); Rikimaru Sakamoto, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 15/303,873

(22) PCT Filed: May 11, 2015

(86) PCT No.: PCT/JP2015/063502
§ 371 (c)(1),
(2) Date: Oct. 13, 2016

(87) PCT Pub. No.: WO2015/178236
PCT Pub. Date: Nov. 26, 2015

(65) Prior Publication Data
US 2017/0045819 A1    Feb. 16, 2017

(30) Foreign Application Priority Data

May 22, 2014   (JP) .................................. 2014-106314

(51) Int. Cl.
*G03F 7/11*     (2006.01)
*G03F 7/16*     (2006.01)
(Continued)

(52) U.S. Cl.
CPC .............. *G03F 7/11* (2013.01); *C08F 220/14* (2013.01); *C08F 220/58* (2013.01); *C09D 133/26* (2013.01); *G03F 7/162* (2013.01); *G03F 7/168* (2013.01); *G03F 7/2002* (2013.01); *G03F 7/2037* (2013.01); *G03F 7/26* (2013.01); *G03F 7/40* (2013.01); *H01L 21/3081* (2013.01);
(Continued)

(58) Field of Classification Search
CPC . G03F 7/11; G03F 7/094; G03F 7/091; G03F 7/09; C09D 133/26; C09D 133/14; H01L 21/3086; H01L 21/3081
See application file for complete search history.

(56) References Cited

U.S. PATENT DOCUMENTS

2004/0132857 A1*  7/2004  Barton .................... G03F 7/027
                                                 522/168
2006/0134547 A1*  6/2006  Huang .................... G03F 7/091
                                                 430/270.1
(Continued)

FOREIGN PATENT DOCUMENTS

JP   2001-027810 A    1/2001
JP   2002-530696 A    9/2002
(Continued)

OTHER PUBLICATIONS

English translation of WO 2012/081619 a generated with Google translate from Patent Scope, World Intellectual Property Orgnaization website, generated Jan. 4, 2017, 43 pages.*
(Continued)

*Primary Examiner* — Cynthia Hamilton
(74) *Attorney, Agent, or Firm* — Oliff PLC

(57) ABSTRACT

A resist underlayer film-forming composition for lithography capable of being dry-etched during pattern transfer from the upper layer or during substrate processing and capable of being removed with an alkaline aqueous solution after the substrate processing. A resist underlayer film-forming composition for lithography includes a polymer (A) including a unit structure of Formula (1) and a unit structure of Formula (2); a crosslinkable compound (B) having at least two groups selected from blocked isocyanate groups, methylol group, or $C_{1-5}$ alkoxy methyl groups; and a solvent (C), characterized in that the polymer (A) is a polymer in which the unit structure of Formula (1) and the unit structure of Formula (2) are copolymerized in a mol % ratio of the unit structure of Formula (1):the unit structure of Formula (2)=25 to 60:75 to 40.

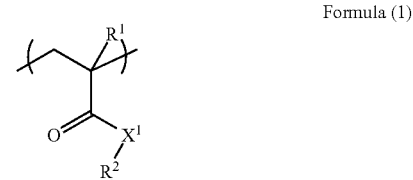

Formula (1)

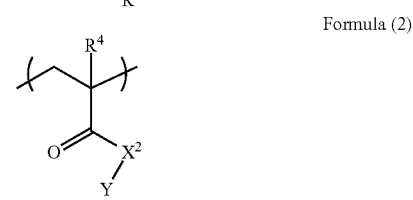

Formula (2)

11 Claims, No Drawings

(51) Int. Cl.
G03F 7/20 (2006.01)
G03F 7/26 (2006.01)
G03F 7/40 (2006.01)
C08F 220/14 (2006.01)
C08F 220/58 (2006.01)
C09D 133/26 (2006.01)
H01L 21/027 (2006.01)
H01L 21/033 (2006.01)
H01L 21/308 (2006.01)

(52) U.S. Cl.
CPC ...... *H01L 21/3086* (2013.01); *H01L 21/0271* (2013.01); *H01L 21/0332* (2013.01)

(56) References Cited

U.S. PATENT DOCUMENTS

2014/0106570 A1* 4/2014 Someya .............. H01L 21/3081
438/703

2015/0079792 A1* 3/2015 Shigaki ............... H01L 21/3081
438/703

FOREIGN PATENT DOCUMENTS

| JP | 2008-524382 A | 7/2008 |
| JP | 2009-025670 A | 2/2009 |
| JP | 2014-074730 A | 4/2014 |
| WO | 2000/001752 A1 | 1/2000 |
| WO | 2005/111724 A1 | 11/2005 |
| WO | 2012/017790 A1 | 2/2012 |
| WO | 2012/081619 A1 | 6/2012 |
| WO | 2012/161126 A1 | 11/2012 |
| WO | 2013/161372 A1 | 10/2013 |

OTHER PUBLICATIONS

Jun. 30, 2015 International Search Report issued in International Patent Application No. PCT/JP2015/063502.

* cited by examiner

RESIST UNDERLAYER FILM-FORMING COMPOSITION FOR LITHOGRAPHY CONTAINING POLYMER HAVING ACRYLAMIDE STRUCTURE AND ACRYLIC ACID ESTER STRUCTURE

TECHNICAL FIELD

The present invention relates to a resist underlayer film-forming composition for lithography that is effective in semiconductor substrate processing, and relates to a method of forming a resist pattern using the resist underlayer film-forming composition, and a method of manufacturing a semiconductor device.

BACKGROUND ART

In the manufacture of semiconductor devices, fine processing by lithography using a photoresist composition has conventionally been performed. The fine processing is a processing method of forming a thin film of a photoresist composition on a substrate to be processed such as a silicon wafer; irradiating the thin film with an active ray such as ultraviolet ray through a mask pattern having a semiconductor device pattern depicted therein, thereby carrying out development, and etching the substrate to be processed such as a silicon wafer with the obtained photoresist pattern as a protection film. However, with the higher integration of semiconductor devices in recent years, an active ray to be employed tends to have a shorter wavelength, namely, shift from KrF excimer laser (248 nm) to ArF excimer laser (193 nm). Accordingly, the influence of diffuse reflection of the active ray on the substrate or the influence of standing waves has become a serious problem. Consequently, a method of providing an anti-reflective coating (bottom anti-reflective coating, BARC) between a photoresist and a substrate to be processed has been widely studied. For example, a photosensitive resist underlayer film-forming composition containing a polymer having an acrylamide structure is disclosed (refer to Patent Document 1).

A resist underlayer film-forming composition containing a polymer having a unit structure of hydroxyacrylamide is disclosed (refer to Patent Document 2).

An anti-reflective coating-forming composition containing a polymer having a unit structure of hydroxyalkylenemethacrylamide and a unit structure of aromatic alkylene methacrylate is disclosed (refer to Patent Document 3).

In the future, when a finer resist pattern is further pursued, a problem about resolution or a problem of collapse of a resist pattern after development should arise, whereby reduction of the film thickness of a resist is desired. It is therefore difficult to attain a resist pattern film thickness sufficient for processing a substrate, and there has arisen a need for a process for allowing not only a resist pattern but also a resist underlayer film formed between a resist and a semiconductor substrate to be processed to function as a mask in substrate processing. As the resist underlayer film for such a process, unlike conventional high etch rate (high etching rate) resist underlayer films, there is a growing demand for a resist underlayer film for lithography having a selection ratio of dry etching rate close to that of a resist, a resist underlayer film for lithography having a selection ratio of dry etching rate smaller than that of a resist, and a resist underlayer film for lithography having a selection ratio of dry etching rate smaller than that of a semiconductor substrate.

An organic hard mask layer-forming composition having an acrylamide structure and being removable by an alkaline aqueous solution is disclosed (refer to Patent Document 4).

PRIOR ART DOCUMENTS

Patent Documents

Patent Document 1: International Application Pamphlet WO 2005/111724

Patent Document 2: Japanese Patent Application Publication No. 2009-025670 (JP 2009-025670 A)

Patent Document 3: Japanese Patent Application Publication No. 2001-027810 (JP 2001-027810 A)

Patent Document 4: International Application Pamphlet WO 2012/161126

SUMMARY OF THE INVENTION

Problem to be Solved by the Invention

An object of the present invention is to provide a resist underlayer film-forming composition for use in a lithography process in the manufacture of semiconductor devices. Another object of the present invention is to provide a resist underlayer film for lithography having a selection ratio of dry etching rate close to that of a resist, a resist underlayer film for lithography having a selection ratio of dry etching rate smaller than that of the resist, and a resist underlayer film for lithography having a selection ratio of dry etching rate smaller than that of a semiconductor substrate, the resist underlayer film for lithography allowing an excellent resist pattern to be obtained without causing intermixing with an inorganic hard mask layer. Another object of the present invention is to impart, to a resist underlayer film, the performance of effectively absorbing light reflected on a substrate when irradiated light having a wavelength of, for example, 248 nm, 193 nm, or 157 nm is used for fine processing. A further object of the present invention is to provide a method of forming a resist pattern using a resist underlayer film-forming composition. A further object of the present invention is to provide a resist underlayer film-forming composition for forming a resist underlayer film capable of being dry-etched during pattern transfer from the upper layer or during substrate processing and capable of being removed with an alkaline aqueous solution after the substrate processing.

Means for Solving the Problem

The present invention provides: according to a first aspect, a resist underlayer film-forming composition comprising a polymer (A) including a unit structure of Formula (1) and a unit structure of Formula (2), a crosslinkable compound (B) having at least two groups selected from blocked isocyanate groups, methylol group, or $C_{1-5}$ alkoxy methyl groups, and a solvent (C), characterized in that the polymer (A) is a polymer in which the unit structure of Formula (1) and the unit structure of Formula (2) are copolymerized in a mol % ratio of the unit structure of Formula (1):the unit structure of Formula (2)=25 to 60:75 to 40

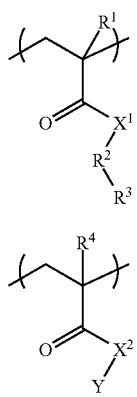

Formula (1)

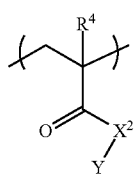

Formula (2)

(where each of $R^1$ and $R^4$ is a hydrogen atom or methyl group; each of $X^1$ and $X^2$ is an NH group or an oxygen atom; $R^2$ is an aromatic ring; $R^3$ is a hydroxy group or a carboxy group; and Y is an optionally substituted $C_{1-10}$ alkyl group);

according to a second aspect, the resist underlayer film-forming composition according to the first aspect, wherein $R^2$ is a benzene ring;

according to a third aspect, the resist underlayer film-forming composition according to the first aspect or the second aspect, wherein the crosslinkable compound (B) is included in a ratio of 1% by mass to 40% by mass with respect to the mass of the polymer (A);

according to a fourth aspect, the resist underlayer film-forming composition according to any one of the first aspect to the third aspect, further comprising a crosslinking catalyst;

according to a fifth aspect, a method of manufacturing a semiconductor device, the method comprising the steps of: forming a resist underlayer film from the resist underlayer film-forming composition according to any one of the first aspect to the fourth aspect on a semiconductor substrate; forming a resist film on the resist underlayer film; forming a resist pattern in the resist film through light or electron beam irradiation and development; etching the resist underlayer film using the formed resist pattern; and processing the semiconductor substrate using the patterned resist underlayer film; and according to a sixth aspect, a method of manufacturing a semiconductor device, the method comprising the steps of: forming a resist underlayer film from the resist underlayer film-forming composition according to any one of the first aspect to the fourth aspect on a semiconductor substrate; forming an inorganic hard mask layer on the resist underlayer film; further forming a resist film on the inorganic hard mask layer; forming a resist pattern in the resist film through light or electron beam irradiation and development; etching the inorganic hard mask layer using the formed resist pattern; etching the resist underlayer film using the patterned inorganic hard mask layer; and processing the semiconductor substrate using the patterned resist underlayer film.

Effects of the Invention

A resist underlayer film formed from the resist underlayer film-forming composition of the present invention can be used to form a good resist pattern shape without causing intermixing with an inorganic hard mask layer provided on the upper layer of the resist underlayer film.

Furthermore, the resist underlayer film-forming composition of the present invention can provide an excellent resist underlayer film having a selection ratio of dry etching rate close to that of a resist, a selection ratio of dry etching rate smaller than that of a resist, or a selection ratio of dry etching rate smaller than that of a semiconductor substrate.

Therefore, with the resist underlayer film obtained from the resist underlayer film-forming composition of the present invention, a resist pattern transferred to an inorganic hard mask layer serving as an upper layer can be transferred to the resist underlayer film by dry etching. Furthermore, with the resist pattern transferred to the resist underlayer film, a semiconductor substrate can be processed by dry etching.

Furthermore, the resist underlayer film-forming composition of the present invention can impart the performance of efficiently controlling reflection on the substrate to the resist underlayer film formed of the resist underlayer film-forming composition, so that the resist underlayer film can additionally have an effect as an anti-reflective coating against exposure light.

Therefore, the resist underlayer film formed from the resist underlayer film-forming composition for lithography of the present invention can be used as a planarizing film, an anti-contamination film for a resist layer, and a film having dry etch selectivity. Accordingly, resist pattern formation in a lithography process in the manufacture of a semiconductor device can be performed easily and accurately.

Furthermore, the resist underlayer film-forming composition for lithography of the present invention has high thermal stability, and therefore, in the resist underlayer film formed from the composition, contamination of the upper layer film by a decomposed product during vacuum evaporation and baking for forming an inorganic hard mask layer can be prevented, and a sufficient temperature margin in a baking process can be provided.

Furthermore, the resist underlayer film formed from the resist underlayer film-forming composition for lithography of the present invention can be removed with an alkaline aqueous solution after the processing of a semiconductor substrate.

MODES FOR CARRYING OUT THE INVENTION

The present invention provides a resist underlayer film-forming composition comprising: a polymer (A) including a unit structure of Formula (1) and a unit structure of Formula (2); a crosslinkable compound (B) having at least two groups selected from blocked isocyanate groups, methylol group, or $C_{1-5}$ alkoxy methyl groups; and a solvent (C), the composition being characterized in that the polymer (A) is a polymer in which the unit structure of Formula (1) and the unit structure of Formula (2) are copolymerized in a mol % ratio of the unit structure of Formula (1):the unit structure of Formula (2)=25 to 60:75 to 40.

The resist underlayer film-forming composition of the present invention may include additives, such as an acid generator and a surfactant, as necessary.

The solid content of this composition is 0.1% by mass to 70% by mass, or 0.1% by mass to 60% by mass. The solid content means the content of components remaining after removal of the solvent (C) from the resist underlayer film-forming composition.

In the solid content, the polymer (A) may be contained in a ratio of 1% by mass to 99.9% by mass, 1% by mass to 99% by mass, or 50% by mass to 98% by mass. The weight-average molecular weight of the polymer (A) may be in a range of, for example, from 1,000 to 1,000,000, from 1,000 to 100,000, or from 1,000 to 50,000.

In Formula (1), and Formula (2), each of $R^1$ and $R^4$ is a hydrogen atom or methyl group, each of $X^1$ and $X^2$ is an NH group or an oxygen atom, $R^2$ is an aromatic ring, $R^3$ is a hydroxy group or a carboxy group, and Y is an optionally substituted $C_{1-10}$ alkyl group.

Examples of the aromatic ring include a benzene ring, a naphthalene ring, an anthracene ring, and a biphenyl ring, and a particularly preferred aromatic ring is a benzene ring.

Examples of a substituent in the alkyl group include a hydroxy group, a carboxy group, a halogen group, a nitro group, and an amino group.

Examples of the $C_{1-10}$ alkyl group include methyl group, ethyl group, n-propyl group, i-propyl group, cyclopropyl group, n-butyl group, i-butyl group, s-butyl group, t-butyl group, cyclobutyl group, 1-methyl-cyclopropyl group, 2-methyl-cyclopropyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, cyclopentyl group, 1-methyl-cyclobutyl group, 2-methyl-cyclobutyl group, 3-methyl-cyclobutyl group, 1,2-dimethyl-cyclopropyl group, 2,3-dimethyl-cyclopropyl group, 1-ethyl-cyclopropyl group, 2-ethyl-cyclopropyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, 1-ethyl-2-methyl-n-propyl group, cyclohexyl group, 1-methyl-cyclopentyl group, 2-methyl-cyclopentyl group, 3-methyl-cyclopentyl group, 1-ethyl-cyclobutyl group, 2-ethyl-cyclobutyl group, 3-ethyl-cyclobutyl group, 1,2-dimethyl-cyclobutyl group, 1,3-dimethyl-cyclobutyl group, 2,2-dimethyl-cyclobutyl group, 2,3-dimethyl-cyclobutyl group, 2,4-dimethyl-cyclobutyl group, 3,3-dimethyl-cyclobutyl group, 1-n-propyl-cyclopropyl group, 2-n-propyl-cyclopropyl group, 1-i-propyl-cyclopropyl group, 2-i-propyl-cyclopropyl group, 1,2,2-trimethyl-cyclopropyl group, 1,2,3-trimethyl-cyclopropyl group, 2,2,3-trimethyl-cyclopropyl group, 1-ethyl-2-methyl-cyclopropyl group, 2-ethyl-1-methyl-cyclopropyl group, 2-ethyl-2-methyl-cyclopropyl group, and 2-ethyl-3-methyl-cyclopropyl group.

The structure of the polymer (A) used in the present invention can be illustrated as below.

Formula (A-1)

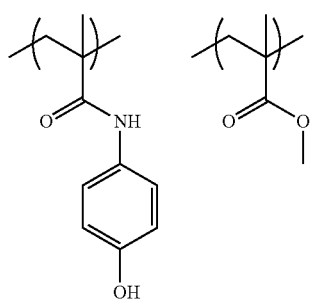

Formula (A-2)

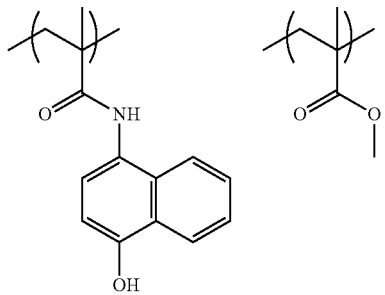

Formula (A-3)

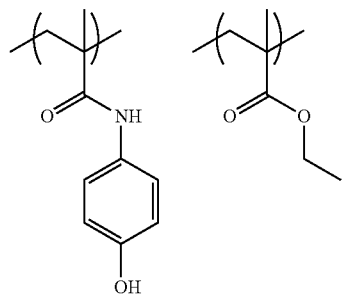

Formula (A-4)

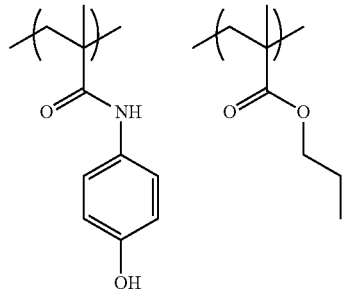

Formula (A-5)

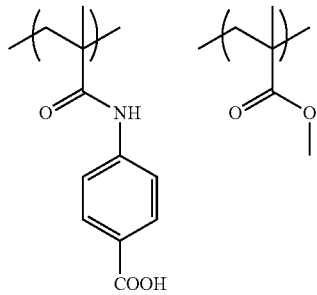

Formula (A-6)

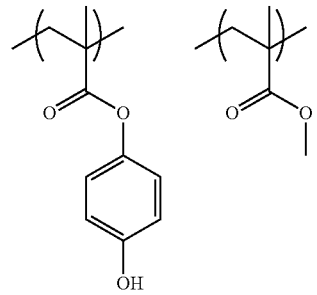

Formula (A-7)

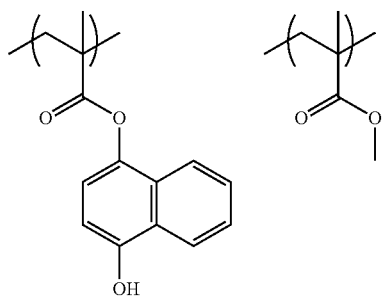

Formula (A-8)

Formula (A-9)

Formula (A-10)

Formula (A-11)

Formula (A-12)

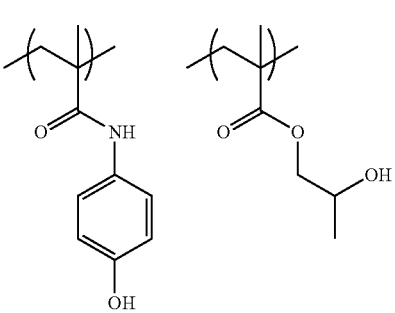

Formula (A-13)

Formula (A-14)

Formula (A-15)

The crosslinkable compound (B) used in the present invention is a crosslinkable compound having at least two of blocked isocyanate groups, methylol group, or $C_{1-5}$ alkoxy methyl groups.

The crosslinkable compound (B) is included in the resist underlayer film-forming composition in a ratio of 1% by mass to 40% by mass, and preferably 1% by mass to 30% by mass with respect to the polymer (A).

The blocked isocyanate group refers to an organic group in which an isocyanate group (—N=C=O) is blocked by an appropriate protecting group.

The blocked isocyanate group can be formed by reacting an isocyanate group with a blocking agent.

In a reaction with the hydroxy group or the carboxy group in the polymer (A), the blocking agent is removed, and the isocyanate group reacts with the hydroxy group or the carboxy group to form a crosslinked structure.

The blocking agent is an active hydrogen-containing compound capable of reacting with isocyanate, and examples of the blocking agent include alcohol, phenol, polycyclic phenol, amide, imide, imine, thiol, oxime, lactam, an active hydrogen-containing heterocyclic ring, and an active methylene-containing compound.

Examples of the alcohol serving as the blocking agent include $C_{1-40}$ alcohol, such as methanol, ethanol, propanol, isopropanol, butanol, pentanol, hexanol, octanol, ethylene chlorohydrin, 1,3-dichloro-2-propanol, t-butanol, t-pentanol, 2-ethylhexanol, cyclohexanol, lauryl alcohol, ethylene glycol, butylene glycol, trimethylolpropane, glycerol, ethylene glycol monomethyl ether, ethylene glycol monoethyl ether, ethylene glycol monobutyl ether, diethylene glycol monomethyl ether, propylene glycol monomethyl ether, propylene glycol monoethyl ether, and benzyl alcohol.

Examples of the phenol serving as the blocking agent include $C_{6-20}$ phenols, such as phenol, chlorophenol, and nitrophenol.

Examples of the phenol derivative serving as the blocking agent include $C_{6-20}$ phenol derivatives, and examples of the $C_{6-20}$ phenol derivative include para-t-butyl phenol, cresol, xylenol, and resorcinol.

Examples of the polycyclic phenol serving as the blocking agent include $C_{10-20}$ polycyclic phenols that are aromatic condensed rings having a phenolic hydroxy group, such as hydroxynaphthalene and hydroxyanthracene.

Examples of the amide serving as the blocking agent include $C_{1-20}$ amides, such as acetanilide, hexanamide, octanediamide, succinamide, benzenesulfonamide, and ethanediamide.

Examples of the imide serving as the blocking agent include $C_{6-20}$ imides, such as cyclohexanedicarboxyimide, cyclohexanedicarboxyimide, benzenedicarboxyimide, cyclobutanedicarboxyimide, and carbodiimide.

Examples of the imine serving as the blocking agent include $C_{1-20}$ imines, such as hexane-1-imine, 2-propanimine, and ethane-1,2-imine.

Examples of the thiol serving as the blocking agent include $C_{1-20}$ thiols, such as ethanethiol, butanethiol, thiophenol, and 2,3-butanedithiol.

Examples of the oxime serving as the blocking agent include $C_{1-20}$ oximes, such as acetoxime, methylethylketoxime, cyclohexanone oxime, dimethylketoxime, methylisobutylketoxime, methylamylketoxime, formamide oxime, acetaldoxime, diacetyl monoxime, benzophenone oxime, and cyclohexane oxime.

Examples of the lactam serving as the blocking agent include $C_{4-20}$ lactams, such as ε-caprolactam, δ-valerolactam, γ-butyrolactam, β-propyllactam, γ-pyrrolidone, and lauryllactam.

Examples of the active hydrogen-containing heterocyclic compound serving as the blocking agent include $C_{3-30}$ active hydrogen-containing heterocyclic compounds, such as pyrrole, imidazole, pyrazole, piperidine, piperazine, morpholine, pyrindine, indole, indazole, purine, and carbazole.

Examples of the active methylene-containing compound serving as the blocking agent include $C_{3-20}$ active methylene-containing compounds, such as dimethyl malonate, diethyl malonate, methyl acetoacetate, ethyl acetoacetate, and acetylacetone.

Specific examples of the crosslinkable compound (B) having at least two blocked isocyanate groups include TAKENATE [registered trademark] B-830 and TAKENATE B-870N (manufactured by Mitsui Chemicals, Inc.), and VESTANAT [registered trademark] B1358/100 (manufactured by Evonik Degussa).

Examples of the crosslinkable compound (B) having at least two of methylol group or $C_{1-5}$ alkoxy methyl groups include a melamine-based compound, a substituted urea-based compound, and a polymer thereof. Examples of the compounds include methoxy-methylated glycoluril, butoxy-methylated glycoluril, methoxy-methylated melamine, butoxy-methylated melamine, methoxy-methylated benzoguanamine, butoxy-methylated benzoguanamine, methoxy-methylated urea, butoxy-methylated urea, methoxy-methylated thiourea, and methoxy-methylated thiourea. Condensed products of these compounds may also be used.

In the present invention, as a catalyst for accelerating the crosslinking reaction, an acidic compound, such as p-toluenesulfonic acid, trifluoromethanesulfonic acid, pyridinium p-toluenesulfonic acid, salicylic acid, sulfosalicylic acid, citric acid, benzoic acid, hydroxybenzoic acid, or naphthalenecarboxylic acid; and/or a thermal acid generator, such as 2,4,4,6-tetrabromocyclohexadienone, benzoin tosylate, 2-nitrobenzyl tosylate, or other organic sulfonic acid alkyl esters may be blended. Such a catalyst is blended in an amount of 0.0001% by mass to 20% by mass, preferably 0.0005% by mass to 10% by mass, and preferably 0.01% by mass to 3% by mass with respect to the total solid content.

To the resist underlayer film-forming composition of the present invention, a photoacid generator may be added for the purpose of matching the acidity of the composition with the acidity of a photoresist that covers the composition as the upper layer in a lithography process. Preferable examples of the photoacid generator include onium salt-based photoacid generators, such as bis(4-t-butylphenyl)iodonium trifluoromethanesulfonate and triphenylsulfonium trifluoromethanesulfonate; halogen-containing compound-based photoacid generators, such as phenyl-bis(trichloromethyl)-s-triazine; sulfonic acid-based photoacid generators, such as benzoin tosylate and N-hydroxysuccinimide trifluoromethanesulfonate. The photoacid generator may be added in an amount of 0.2% by mass to 10% by mass, and preferably 0.4% by mass to 5% by mass with respect to the total solid content.

Besides the substances described above, an additional light absorbing agent, a rheology controlling agent, an adhesion assistant, a surfactant, or other substances may be added to the resist underlayer film-forming composition for lithography of the present invention, as necessary.

Preferable examples of the additional light absorbing agent include commercially available light absorbing agents described in "Kogyoyo shikiso no gijyutu to shijyo (technology and market of industrial dyes)" (CMC Publishing Co., Ltd.) and "Senryo Binran (dye handbook)" (edited by The Society of Synthetic Organic Chemistry, Japan), such as C. I. Disperse Yellow 1, 3, 4, 5, 7, 8, 13, 23, 31, 49, 50, 51, 54, 60, 64, 66, 68, 79, 82, 88, 90, 93, 102, 114, and 124; C. I. Disperse Orange 1, 5, 13, 25, 29, 30, 31, 44, 57, 72, and 73; C. I. Disperse Red 1, 5, 7, 13, 17, 19, 43, 50, 54, 58, 65, 72, 73, 88, 117, 137, 143, 199, and 210; C. I. Disperse Violet 43; C. I. Disperse Blue 96; C. I. Fluorescent Brightening Agent 112, 135, and 163; C. I. Solvent Orange 2 and 45; C. I. Solvent Red 1, 3, 8, 23, 24, 25, 27, and 49; C. I. Pigment Green 10; and C. I. Pigment Brown 2. The light absorbing agent is blended in a ratio of usually 10% by mass or less, and preferably 5% by mass or less with respect to the total solid content of the resist underlayer film-forming composition for lithography.

The rheology controlling agent is added mainly for the purpose of improving the fluidity of the resist underlayer film-forming composition, particularly for the purpose of improving the film thickness uniformity of the resist underlayer film and enhancing filling of the resist underlayer film-forming composition into holes during a baking process. Specific examples of the rheology controlling agent include phthalic acid derivatives, such as dimethyl phthalate, diethyl phthalate, diisobutyl phthalate, dihexyl phthalate, and butylisodecyl phthalate; adipic acid derivatives, such as di-n-butyl adipate, diisobutyl adipate, diisooctyl adipate, and octyldecyl adipate; maleic acid derivatives, such as di-n-butyl maleate, diethyl maleate, and dinonyl maleate; oleic acid derivatives, such as methyl oleate, butyl oleate, and tetrahydrofurfuryl oleate; and stearic acid derivatives, such as n-butyl stearate and glyceryl stearate. Such a rheology controlling agent is blended in a ratio of usually less than 30% by mass with respect to the total solid content of the resist underlayer film-forming composition for lithography.

The adhesion assistant is added mainly for the purpose of improving adhesion between the resist underlayer film and a substrate or a resist, particularly for the purpose of preventing separation of the resist during development. Specific examples of the adhesion assistant include chlorosilanes, such as trimethylchlorosilane, dimethylvinylchlorosilane, methyldiphenylchlorosilane, and chloromethyldimethylchlorosilane; alkoxysilanes, such as trimethylmethoxysilane, dimethyldiethoxysilane, methyldimethoxysilane, dimethylvinylethoxysilane, diphenyldimethoxysilane, and phenyltriethoxysilane; silazanes, such as hexamethyldisilazane, N,N'-bis(trimethylsilyl)urea, dimethyltrimethylsilylamine, and trimethylsilylimidazole; silanes, such as vinyltrichlorosilane, γ-chloropropyltrimethoxysilane, γ-aminopropyltriethoxysilane, and γ-glycidoxypropyltrimethoxysilane; heterocyclic compounds, such as benzotriazole, benzimidazole, indazole, imidazole, 2-mercaptobenzimidazole, 2-mercaptobenzothiazole, 2-mercaptobenzooxazole, urazole, thiouracil, mercaptoimidazole, and mercaptopyrimidine; ureas, such as 1,1-dimethylurea and 1,3-dimethylurea; and thiourea compounds. Such an adhesion assistant is blended in a ratio of usually less than 5% by mass, and preferably less than 2% by mass with respect to the total solid content of the resist underlayer film-forming composition for lithography.

In the resist underlayer film-forming composition for lithography of the present invention, a surfactant may be blended for the purpose of preventing pinholes and striations and further improving coating properties against surface coating irregularities. Examples of the surfactant include nonionic surfactants, such as polyoxyethylene alkyl ethers such as polyoxyethylene lauryl ether, polyoxyethylene stearyl ether, polyoxyethylene cetyl ether, and polyoxyethylene oleyl ether, polyoxyethylene alkylallyl ethers such as polyoxyethylene octylphenol ether and polyoxyethylene nonylphenol ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorine-based surfactants, such as EFTOP EF301, EF303, and EF352 (trade name, manufactured by Tohkem Products Corporation), MEGAFACE F171, F173, R-30, R-40, and R-40LM (trade name, manufactured by DIC Corporation), Fluorad FC430 and FC431 (trade name, manufactured by Sumitomo 3M Limited), Asahi Guard AG710, and SURFLON S-382, SC101, SC102, SC103, SC104, SC105, and SC106 (trade name, manufactured by Asahi Glass Co., Ltd.); and an organosiloxane polymer KP341 (manufactured by Shin-Etsu Chemical Co., Ltd.). Such a surfactant is blended in an amount of usually 2.0% by mass or less, and preferably 1.0% by mass or less with respect to the total solid content of the resist underlayer film-forming composition for lithography of the present invention. These surfactants may be added singly or in combination of two or more of them.

In the present invention, the solvent (C) to dissolve the polymers, the crosslinking component, the crosslinking catalyst, and other ingredients, include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol monoethyl ether, propylene glycol monoethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, and butyl lactate. These organic solvents may be used singly or in combination of two or more of them.

Furthermore, a high-boiling point solvent, such as propylene glycol monobutyl ether or propylene glycol monobutyl ether acetate, may be mixed and used. Among these solvents, propylene glycol monomethyl ether, propylene glycol monomethyl ether acetate, ethyl lactate, butyl lactate, and cyclohexanone are preferable in terms of improving the leveling property.

As the resist used in the present invention, a photoresist and an electron beam resist may be employed.

Both negative and positive photoresists may be used as the photoresist applied to the upper part of the resist underlayer film formed from the resist underlayer film-forming composition for lithography of the present invention. Examples of the photoresist include a positive photoresist made of a novolac resin and a 1,2-naphthoquinone diazide sulfonic acid ester; a chemically amplified photoresist made of a photoacid generator and a binder having a group that is decomposed by an acid to increase an alkali dissolution rate; a chemically amplified photoresist made of an alkali-soluble binder, a low molecular weight compound that is decomposed by an acid to increase the alkali dissolution rate of the photoresist, and a photoacid generator; a chemically amplified photoresist made of a binder having a group that is decomposed by an acid to increase an alkali dissolution rate, a low molecular weight compound that is decomposed by an acid to increase the alkali dissolution rate of the photoresist, and a photoacid generator; and a photoresist having a Si atom in its skeleton, and, for example, a photoresist with a trade name of APEX-E, manufactured by Rohm and Haas Corporation.

Examples of the electron beam resist applied to the upper part of the resist underlayer film for lithography formed from the composition of the present invention include a composition including a resin having a Si—Si bond in its main chain and an aromatic ring at its end and an acid generator that generates an acid by electron beam irradiation, and a composition including a poly(p-hydroxystyrene)

in which a hydroxy group is substituted with an organic group containing N-carboxyamine and an acid generator that generates an acid by electron beam irradiation. The latter electron beam resist composition is formed such that an acid generated from the acid generator by electron beam irradiation reacts with the N-carboxy aminoxy group in a polymer side chain, and the polymer side chain is decomposed into a hydroxy group to exhibit alkali solubility, whereby the resist composition is dissolved in an alkaline developer to form a resist pattern. Examples of the acid generator that generates an acid by electron beam irradiation include halogenated organic compounds, such as 1,1-bis[p-chlorophenyl]-2,2,2-trichloroethane, 1,1-bis[p-methoxyphenyl]-2,2,2-trichloroethane, 1,1-bis[p-chlorophenyl]-2,2-dichloroethane, and 2-chloro-6-(trichloromethyl)pyridine; onium salts, such as triphenylsulfonium salts and diphenyliodonium salts; and sulfonic acid esters, such as nitrobenzyl tosylate and dinitrobenzyl tosylate.

As a developer for a resist having the resist underlayer film formed using the resist underlayer film-forming composition for lithography of the present invention, an aqueous solution of alkalis may be used. Examples of the alkalis include inorganic alkalis, such as sodium hydroxide, potassium hydroxide, sodium carbonate, sodium silicate, sodium metasilicate, and aqueous ammonia; primary amines, such as ethylamine and n-propylamine; secondary amines, such as diethylamine and di-n-butylamine; tertiary amines, such as triethylamine and methyldiethylamine; alcohol amines, such as dimethylethanolamine and triethanolamine; quaternary ammonium salts, such as tetramethylammonium hydroxide, tetraethylammonium hydroxide, and choline; and cyclic amines, such as pyrrole and piperidine. To the aqueous solution of the alkalis, an adequate amount of alcohols such as isopropyl alcohol and a surfactant such as a nonionic surfactant may be added and used. Among these developers, quaternary ammonium salts are preferable, and tetramethylammonium hydroxide and choline are more preferable.

Next, a method of forming a resist pattern according to the present invention will be described. The resist underlayer film-forming composition is applied to a substrate for use in the manufacture of precision integrated circuit elements (for example, a transparent substrate, such as a silicon/silicon dioxide coating, a glass substrate, or an ITO substrate) by an appropriate coating method, such as a spinner or a coater, and then baked and cured to produce a coating-type resist underlayer film. Here, the film thickness of the resist underlayer film is preferably 0.01 µm to 3.0 µm. The conditions of the baking after the resist underlayer film forming composition is applied are 80° C. to 400° C. for 0.5 minutes to 120 minutes. Subsequently, a resist is applied directly to the resist underlayer film, or, as necessary, the resist is applied to a single layer to several layers of a coating material formed on the coating-type resist underlayer film, and the resist is developed by light or electron beam irradiation through a predetermined mask, followed by rinsing and drying, whereby a good resist pattern is obtained. Heating after the light or electron beam irradiation (PEB: Post Exposure Bake) may be performed as necessary. Then, a portion of the resist underlayer film in which the resist is developed and removed through the steps described above is removed by dry etching to form a desired pattern on the substrate.

The exposure light used for the photoresist is actinic rays, such as near ultraviolet rays, far ultraviolet rays, or extreme ultraviolet rays (for example, EUV). For example, a beam having a wavelength of 248 nm (KrF laser beam), 193 nm (ArF laser beam), or 157 nm ($F_2$ laser beam) is used. Any light irradiation method may be used without a particular limit as long as an acid can be generated from a photoacid generator using the method, with an exposure of 1 mJ/cm$^2$ to 2,000 mJ/cm$^2$, 10 mJ/cm$^2$ to 1,500 mJ/cm$^2$, or 50 mJ/cm$^2$ to 1,000 mJ/cm$^2$.

The electron beam irradiation for the electron beam resist may be carried out using, for example, an electron beam irradiator.

In the present invention, a semiconductor device can be produced through the steps of: forming a resist underlayer film from the resist underlayer film-forming composition of the present invention on a semiconductor substrate; forming a resist film on the resist underlayer film; forming a resist pattern through light or electron beam irradiation and development; etching the resist underlayer film with the formed resist pattern; and processing the semiconductor substrate using the patterned resist underlayer film.

In the future, when a finer resist pattern is further pursued, a problem about resolution or a problem of collapse of a resist pattern after development will arise, whereby reduction of the film thickness of a resist is desired. It is therefore difficult to attain a resist pattern film thickness sufficient for processing a substrate, and there has arisen a need for a process that allows not only a resist pattern but also the resist underlayer film formed between a resist and a semiconductor substrate to be processed to function as a mask in substrate processing. As the resist underlayer film for such process, unlike conventional high etch rate resist underlayer films, there is a growing demand for a resist underlayer film for lithography having a selection ratio of dry etching rate close to that of a resist, a resist underlayer film for lithography having a selection ratio of dry etching rate smaller than that of a resist, and a resist underlayer film for lithography having a selection ratio of dry etching rate smaller than that of a semiconductor substrate. Furthermore, an anti-reflective function can be imparted to such resist underlayer films, so that the resist underlayer films can additionally have the function of conventional anti-reflective coatings.

Meanwhile, for the purpose of attaining a fine resist pattern, a process has been used, in which, in dry etching of a resist underlayer film, the width of each of a resist pattern and the resist underlayer film is made thinner than the pattern width at the time of resist development. As the resist underlayer film for such process, there is a growing demand for a resist underlayer film having a selection ratio of dry etching rate close to that of a resist, unlike conventional high etch rate anti-reflective coatings. Furthermore, an anti-reflective function can be imparted to such resist underlayer film, so that the resist underlayer film can additionally have the function of conventional anti-reflective coatings.

In a process using such a thin-film resist, a resist pattern is transferred to the underlayer film in an etching process, and a substrate is processed using the underlayer film as a mask; or the step of transferring a resist pattern to the underlayer film in an etching process and further transferring the pattern transferred to the underlayer film to a film under the underlayer film using a different gas composition is repeated, and finally, a substrate is processed. The resist underlayer film-forming composition of the present invention and the resist underlayer film formed from the composition are effective in this process, and have sufficient etching resistance for a substrate to be processed (for example, a thermally oxidized silicon film, a silicon nitride film, or a polysilicon film, on a substrate) when the substrate is processed using the resist underlayer film formed from the composition of the present invention.

According to the present invention, after the resist underlayer film of the present invention is formed on a substrate, a resist can be applied directly to the resist underlayer film, or, as necessary, the resist is applied to a single layer to several layers of a coating material formed on the resist underlayer film. The resulting pattern width of the resist is reduced, and even when the resist is thinly applied for the purpose of preventing pattern collapse, the substrate can be processed by selecting an appropriate etching gas.

That is, a semiconductor device can be produced through the steps of: forming a resist underlayer film from the resist underlayer film-forming composition of the present invention on a semiconductor substrate; forming an inorganic hard mask layer using a coating material containing a silicon component and other substances on the resist underlayer film; forming a resist film on the inorganic hard mask layer; forming a resist pattern through light or electron beam irradiation and development; etching the inorganic hard mask layer with the resist pattern; etching the resist underlayer film using the patterned inorganic hard mask layer; and processing the semiconductor substrate using the patterned resist underlayer film.

In the process comprising: forming a resist underlayer film on a substrate from a resist underlayer film-forming composition; forming an inorganic hard mask layer on the resist underlayer film; forming a resist film on the inorganic hard mask layer; forming a resist pattern by exposure and development; transferring the formed resist pattern to the inorganic hard mask layer; transferring the resist pattern transferred to the inorganic hard mask layer to the resist underlayer film; and processing the semiconductor substrate using the resist underlayer film, the resist underlayer film-forming composition of the present invention is advantageous in terms of the following points. In this process, the inorganic hard mask layer is formed of a coating-type composition containing an organic polymer or an inorganic polymer and a solvent, or formed by vacuum evaporation of an inorganic substance. In the case of the vacuum evaporation of an inorganic substance (for example, silicon oxynitride), an evaporated substance is deposited on the surface of the resist underlayer film, and at this time, the temperature of the surface of the resist underlayer film sometimes increases to about 400° C. On the other hand, the resist underlayer film-forming composition for lithography of the present invention has high thermal stability, and therefore, in the resist underlayer film formed from the composition, contamination of an upper layer film caused by a decomposed product during vacuum evaporation and baking for forming the inorganic hard mask can be prevented, and a sufficient temperature margin in the baking process can be provided.

Furthermore, in consideration of the effect of the resist underlayer film-forming composition for lithography of the present invention as an anti-reflective coating, since a light-absorbing moiety of the composition is incorporated in a skeleton, no substance diffuses into the photoresist during heating and drying, and, since the light-absorbing moiety has sufficiently high light-absorbing properties, the high anti-reflective light effect is exhibited.

Furthermore, the resist underlayer film-forming composition for lithography of the present invention can be used as a material for forming a film having the function of preventing reflection of light, and the function of preventing interaction between a substrate and a photoresist or the function of preventing adverse effects, on the substrate, of a material used for the photoresist or a substance produced during exposure of the photoresist, depending on process conditions.

Therefore, the resist underlayer film formed from the resist underlayer film-forming composition for lithography of the present invention can be used as a planarizing film, an anti-contamination film for a resist layer, and a film having dry etch selectivity. Accordingly, resist pattern formation in a lithography process in the manufacture of a semiconductor device can be performed easily and accurately.

The resist underlayer film formed from the composition of the present invention can be removed with an alkaline aqueous solution after the processing of a semiconductor substrate.

EXAMPLES

The weight-average molecular weights were measured by gel permeation chromatography (GPC).

In the measurement, a GPC apparatus manufactured by Tosoh Corporation was used. The measurement conditions were as follows.

GPC column: Shodex [registered trademark] Asahipak [registered trademark] (manufactured by Showa Denko K.K.)

Column temperature: 40° C.

Solvent: N,N-dimethylformamide (DMF)

Flow rate: 0.6 mL/min

Standard sample: Polystyrene (manufactured by Tosoh Corporation)

Synthesis Example 1

20.0 g of N-(4-hydroxyphenyl)methacrylamide (manufactured by Osaka Organic Chemical Industry Ltd.), 11.3 g of methyl methacrylate (manufactured by Tokyo Chemical Industry Co., Ltd.), and 3.7 g of 2,2-azobis(isobutylnitrile) (manufactured by Tokyo Chemical Industry Co., Ltd.) were added to 140.2 g of propylene glycol monomethyl ether, and dissolved therein. This solution was added dropwise to a 300 mL flask containing 58.5 g of propylene glycol monomethyl ether heated to 85° C., and after the completion of the dropwise addition, the mixture was stirred for approximately 15 hours. After the completion of the reaction, to this solution, 45 g of a cation exchange resin (trade name: DOWEX [registered trademark] 550A, manufactured by Muromachi Technos Co., Ltd.) and 45 g of an anion exchange resin (trade name: Amberlite [registered trademark] 15JWET, manufactured by Organo Corporation) were added, and the mixture was subjected to ion exchange treatment at room temperature for 4 hours. After that, the ion exchange resin was removed. The structure of the obtained polymer was equivalent to the structure of Formula (A-1). In the polymer, the proportion of N-(4-hydroxyphenyl)methacrylamide unit:methyl methacrylate unit was 50 mol %:50 mol %. The polymer content (solid content) of the polymer solution was 12.0%. The result of GPC analysis of the obtained compound showed that the weight-average molecular weight Mw of the compound was 5,000 in terms of standard polystyrene.

Synthesis Example 2

16.0 g of N-(4-hydroxyphenyl)methacrylamide (manufactured by Osaka Organic Chemical Industry Ltd.), 21.1 g of methyl methacrylate (manufactured by Tokyo Chemical Industry Co., Ltd.), and 4.3 g of 2,2-azobis(isobutylnitrile)

(manufactured by Tokyo Chemical Industry Co., Ltd.) were added to 165.5 g of propylene glycol monomethyl ether, and dissolved therein. This solution was added dropwise to a 300 mL flask containing 68.9 g of propylene glycol monomethyl ether heated to 85° C., and after the completion of the dropwise addition, the mixture was stirred for approximately 15 hours. After the completion of the reaction, to this solution, 42.0 g of a cation exchange resin (trade name: DOWEX [registered trademark] 550A, manufactured by Muromachi Technos Co., Ltd.) and 42.0 g of an anion exchange resin (trade name: Amberlite [registered trademark] 15JWET, manufactured by Organo Corporation) were added, and the mixture was subjected to ion exchange treatment at room temperature for 4 hours. After that, the ion exchange resin was removed. The structure of the obtained polymer was equivalent to the structure of Formula (A-1). In the polymer, the proportion of N-(4-hydroxyphenyl)methacrylamide unit:methyl methacrylate unit was 30 mol %:70 mol %. The polymer content (solid content) of the polymer solution was 13.7%. The result of GPC analysis of the obtained compound showed that the weight-average molecular weight Mw of the compound was 9,000 in terms of standard polystyrene.

Comparative Synthesis Example 1

5.0 g of N-(4-hydroxyphenyl)methacrylamide (manufactured by Osaka Organic Chemical Industry Ltd.), 0.7 g of methyl methacrylate (manufactured by Tokyo Chemical Industry Co., Ltd.), and 0.7 g of 2,2-azobis(isobutylnitrile) (manufactured by Tokyo Chemical Industry Co., Ltd.) were added to 25.5 g of propylene glycol monomethyl ether, and dissolved therein. This solution was added dropwise to a 100 mL flask containing 10.6 g of propylene glycol monomethyl ether heated to 85° C., and after the completion of the dropwise addition, the mixture was stirred for approximately 15 hours. After the completion of the reaction, to this solution, 6.4 g of a cation exchange resin (trade name: DOWEX [registered trademark] 550A, manufactured by Muromachi Technos Co., Ltd.) and 6.4 g of an anion exchange resin (trade name: Amberlite [registered trademark] 15JWET, manufactured by Organo Corporation) were added, and the mixture was subjected to ion exchange treatment at room temperature for 4 hours. After that, the ion exchange resin was removed. The structure of the obtained polymer was equivalent to the structure of Formula (A-1). In the polymer, the proportion of N-(4-hydroxyphenyl)methacrylamide unit:methyl methacrylate unit was 80 mol %:20 mol %. The polymer content (solid content) of the polymer solution was 12.6%. The result of GPC analysis of the obtained compound showed that the weight-average molecular weight Mw of the compound was 4,700 in terms of standard polystyrene.

Comparative Synthesis Example 2

1.0 g of N-(4-hydroxyphenyl)methacrylamide (manufactured by Osaka Organic Chemical Industry Ltd.), 5.1 g of methyl methacrylate (manufactured by Tokyo Chemical Industry Co., Ltd.), and 0.7 g of 2,2-azobis(isobutylnitrile) (manufactured by Tokyo Chemical Industry Co., Ltd.) were added to 27.1 g of propylene glycol monomethyl ether, and dissolved therein. This solution was added dropwise to a 100 mL flask containing 11.3 g of propylene glycol monomethyl ether heated to 85° C., and after the completion of the dropwise addition, the mixture was stirred for approximately 15 hours. After the completion of the reaction, to this solution, 6.8 g of a cation exchange resin (trade name: DOWEX [registered trademark] 550A, manufactured by Muromachi Technos Co., Ltd.) and 6.8 g of an anion exchange resin (trade name: Amberlite [registered trademark] 15JWET, manufactured by Organo Corporation) were added, and the mixture was subjected to ion exchange treatment at room temperature for 4 hours. After that, the ion exchange resin was removed. The structure of the obtained polymer was equivalent to the structure of Formula (A-1). In the polymer, the proportion of N-(4-hydroxyphenyl)methacrylamide unit:methyl methacrylate unit was 10 mol %:90 mol %. The polymer content (solid content) of the polymer solution was 13.5%. The result of GPC analysis of the obtained compound showed that the weight-average molecular weight Mw of the compound was 4,300 in terms of standard polystyrene.

Example 1

52.7 g of the polymer solution obtained in Synthesis Example 1 (the solution of a polymer containing N-(4-hydroxyphenyl) methacrylamide unit and methyl methacrylate unit at 50 mol %:50 mol %), 1.6 g of a blocked isocyanate-based crosslinking agent (blocked polyisocyanate protected with an oxime group based on an isophorone diisocyanate structure, trade name: VESTANAT [registered trademark] B1358, manufactured by Degussa Japan Co., Ltd.), and 0.06 g of a surfactant (trade name: MEGAFACE [registered trademark] R-40, manufactured by DIC Corporation) were dissolved in 22.4 g of propylene glycol monomethyl ether acetate, 31.5 g of propylene glycol monomethyl ether, and 11.2 g of gamma butyllactone to prepare a solution of a resist underlayer film-forming composition for use in a lithography process using a multilayer film.

Example 2

3.9 g of the polymer solution obtained in Synthesis Example 2 (the solution of a polymer containing N-(4-hydroxyphenyl) methacrylamide unit and methyl methacrylate unit at 30 mol %:70 mol %), 0.15 g of a blocked isocyanate-based crosslinking agent (blocked polyisocyanate protected with an oxime group based on an isophorone diisocyanate structure, trade name: VESTANAT [registered trademark] B1358, manufactured by Degussa Japan Co., Ltd.), and 0.05 g of a surfactant (trade name: MEGAFACE [registered trademark] R-40, manufactured by DIC Corporation) were dissolved in 1.8 g of propylene glycol monomethyl ether acetate, 2.8 g of propylene glycol monomethyl ether, and 0.9 g of gamma butyllactone to prepare a solution of a resist underlayer film-forming composition for use in a lithography process using a multilayer film.

Comparative Example 1

8.9 g of the polymer solution obtained in Comparative Synthesis Example 1 (the solution of a polymer containing N-(4-hydroxyphenyl) methacrylamide unit and methyl methacrylate unit at 80 mol %:20 mol %), 0.3 g of a blocked isocyanate-based crosslinking agent (blocked polyisocyanate protected with an oxime group based on an isophorone diisocyanate structure, trade name: VESTANAT [registered trademark] B1358, manufactured by Degussa Japan Co., Ltd.), and 0.001 g of a surfactant (trade name: MEGAFACE [registered trademark] R-40, manufactured by DIC Corporation) were dissolved in 10.7 g of propylene glycol monomethyl ether to prepare a solution of a resist underlayer film-forming composition for use in a lithography process using a multilayer film.

Comparative Example 2

8.3 g of the polymer solution obtained in Comparative Synthesis Example 2 (the solution of a polymer containing N-(4-hydroxyphenyl) methacrylamide unit and methyl methacrylate unit at 10 mol %:90 mol %), 0.3 g of a blocked isocyanate-based crosslinking agent (blocked polyisocyanate protected with an oxime group based on an isophorone diisocyanate structure, trade name: VESTANAT [registered trademark] B1358, manufactured by Degussa Japan Co., Ltd.), and 0.001 g of a surfactant (trade name: MEGAFACE [registered trademark] R-40, manufactured by DIC Corporation) were dissolved in 11.3 g of propylene glycol monomethyl ether to prepare a solution of a resist underlayer film-forming composition for use in a lithography process using a multilayer film.

(Elution Test into Photoresist Solvent)

The solutions of the resist underlayer film-forming compositions prepared in Examples 1 and 2 and Comparative Examples 1 and 2 were applied to silicon wafers using a spin coater. The coated wafers were baked on a hot plate at 240° C. for one minute to form resist underlayer films (film thickness: 0.20 μm). Immersion tests of these resist underlayer films in OK thinner, serving as a solvent used for resists, (trade name, manufactured by TOKYO OHKA KOGYO CO., LTD.: containing propylene glycol monomethyl ether and propylene glycol monomethyl ether acetate at a volume ratio of 7:3) were carried out. The residual film ratio was obtained in such a manner that each of the resist underlayer films was placed on a spin coater rotating at 2,000 rpm, then the OK thinner serving as a solvent was added dropwise to each of the resist underlayer film for 60 seconds, and immediately after that, the coater was rotated at 3,000 rpm for 30 seconds. Table 1 shows the results. The residual film ratio was calculated by (Film thickness after immersion)/(Film thickness before immersion)×100.

TABLE 1

| | Residual film ratio after elution test (%) | |
|---|---|---|
| Example 1 | Film after baking at 240° C. | 98% |
| Example 2 | Film after baking at 240° C. | 99% |
| Comparative Example 1 | Film after baking at 240° C. | 99% |
| Comparative Example 2 | Film after baking at 240° C. | 0% |

(Evaluation of Step-Covering Property)

The solutions of the resist underlayer film-forming compositions prepared in Examples 1 and 2 and Comparative Examples 1 to 2 were each applied to a stepped substrate using a spin coater. The adopted stepped substrate (manufactured by ADVANTEC) had a step height of 400 nm and an opening diameter/height of the hole of 120 nm/120 nm, and was covered with a silicon oxide film. After the application of the solutions, the obtained samples were baked at 240° C. for 60 seconds, then, the sections of the samples were observed by a scanning electron microscope (SEM). Table 2 shows the results. The samples covered without voids were evaluated as good, on the contrary, the samples having voids observed in the hole were evaluated as poor.

TABLE 2

| | Evaluation result of step-covering property | |
|---|---|---|
| Example 1 | Film after baking at 240° C. | Good |
| Example 2 | Film after baking at 240° C. | Good |
| Comparative Example 1 | Film after baking at 240° C. | Poor |
| Comparative Example 2 | Film after baking at 240° C. | Poor |

INDUSTRIAL APPLICABILITY

The present invention provides a resist underlayer film-forming composition for forming a resist underlayer film that is applicable to a method of forming a resist pattern using a resist underlayer film-forming composition for lithography and that is also capable of being dry-etched during pattern transfer from the upper layer or during substrate processing and capable of being removed with an alkaline aqueous solution after the substrate processing.

The invention claimed is:
1. A resist underlayer film-forming composition comprising:
a polymer (A) including a unit structure of Formula (1) and a unit structure of Formula (2);
a crosslinkable compound (B) having at least two groups selected from blocked isocyanate groups, methylol group, or $C_{1-5}$ alkoxy methyl groups; and
a solvent (C), wherein
the polymer (A) is a polymer in which the unit structure of Formula (1) and the unit structure of Formula (2) are copolymerized in a mol % ratio of the unit structure of Formula (1): the unit structure of Formula (2)=25 to 60:75 to 40

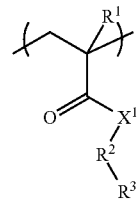

Formula (1)

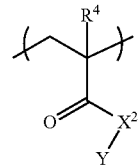

Formula (2)

where
each of $R^1$ and $R^4$ is a hydrogen atom or methyl group;
$X^1$ is an NH group;
$X^2$ is an oxygen atom;
$R^2$ is an benzene ring;
$R^3$ is a hydroxy group or a carboxy group; and
Y is a $C_{1-10}$ alkyl group, which is optionally substituted with a functional group selected from the group consisting of a hydroxy group, a carboxy group, a halogen group, a nitro group, and an amino group.
2. The resist underlayer film-forming composition according to claim 1, wherein the crosslinkable compound (B) is included in a ratio of 1% by mass to 40% by mass with respect to the mass of the polymer (A).

3. The resist underlayer film-forming composition according to claim 1, further comprising a crosslinking catalyst.

4. A method of manufacturing a semiconductor device, the method comprising the steps of:
forming a resist underlayer film from the resist underlayer film-forming composition as claimed in claim 1 on a semiconductor substrate;
forming a resist film on the resist underlayer film;
forming a resist pattern in the resist film through light or electron beam irradiation and development;
etching the resist underlayer film using the formed resist pattern; and
processing the semiconductor substrate using the patterned resist underlayer film.

5. A method of manufacturing a semiconductor device, the method comprising the steps of:
forming a resist underlayer film from the resist underlayer film-forming composition as claimed in claim 1 on a semiconductor substrate;
forming an inorganic hard mask layer on the resist underlayer film;
further forming a resist film on the inorganic hard mask layer;
forming a resist pattern in the resist film through light or electron beam irradiation and development;
etching the inorganic hard mask layer using the formed resist pattern;
etching the resist underlayer film using the patterned inorganic hard mask layer; and
processing the semiconductor substrate using the patterned resist underlayer film.

6. The resist underlayer film-forming composition according to claim 1, wherein the $C_{1-10}$ alkyl group of Y is substituted with a functional group selected from the group consisting of a hydroxy group, a carboxy group, a halogen group, a nitro group, and an amino group.

7. The resist underlayer film-forming composition according to claim 6, wherein the $C_{1-10}$ alkyl group of Y is selected from the group consisting of a methyl group, ethyl group, n-propyl group, i-propyl group, cyclopropyl group, n-butyl group, i-butyl group, s-butyl group, t-butyl group, cyclobutyl group, 1-methyl-cyclopropyl group, 2-methyl-cyclopropyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, cyclopentyl group, 1-methyl-cyclobutyl group, 2-methyl-cyclobutyl group, 3-methyl-cyclobutyl group, 1,2-dimethyl-cyclopropyl group, 2,3-dimethyl-cyclopropyl group, 1-ethyl-cyclopropyl group, 2-ethyl-cyclopropyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, 1-ethyl-2-methyl-n-propyl group, cyclohexyl group, 1-methyl-cyclopentyl group, 2-methyl-cyclopentyl group, 3-methyl-cyclopentyl group, 1-ethyl-cyclobutyl group, 2-ethyl-cyclobutyl group, 3-ethyl-cyclobutyl group, 1,2-dimethyl-cyclobutyl group, 1,3-dimethyl-cyclobutyl group, 2,2-dimethyl-cyclobutyl group, 2,3-dimethyl-cyclobutyl group, 2,4-dimethyl-cyclobutyl group, 3,3-dimethyl-cyclobutyl group, 1-n-propyl-cyclopropyl group, 2-n-propyl-cyclopropyl group, 1-i-propyl-cyclopropyl group, 2-i-propyl-cyclopropyl group, 1,2,2-trimethyl-cyclopropyl group, 1,2,3-trimethyl-cyclopropyl group, 2,2,3-trimethyl-cyclopropyl group, 1-ethyl-2-methyl-cyclopropyl group, 2-ethyl-1-methyl-cyclopropyl group, 2-ethyl-2-methyl-cyclopropyl group, and 2-ethyl-3-methyl-cyclopropyl group.

8. The resist underlayer film-forming composition according to claim 6, wherein the $C_{1-10}$ alkyl group of Y is selected from the group consisting of an ethyl group, n-propyl group, i-propyl group, cyclopropyl group, n-butyl group, i-butyl group, s-butyl group, t-butyl group, cyclobutyl group, 1-methyl-cyclopropyl group, 2-methyl-cyclopropyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, cyclopentyl group, 1-methyl-cyclobutyl group, 2-methyl-cyclobutyl group, 3-methyl-cyclobutyl group, 1,2-dimethyl-cyclopropyl group, 2,3-dimethyl-cyclopropyl group, 1-ethyl-cyclopropyl group, 2-ethyl-cyclopropyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, 1-ethyl-2-methyl-n-propyl group, cyclohexyl group, 1-methyl-cyclopentyl group, 2-methyl-cyclopentyl group, 3-methyl-cyclopentyl group, 1-ethyl-cyclobutyl group, 2-ethyl-cyclobutyl group, 3-ethyl-cyclobutyl group, 1,2-dimethyl-cyclobutyl group, 1,3-dimethyl-cyclobutyl group, 2,2-dimethyl-cyclobutyl group, 2,3-dimethyl-cyclobutyl group, 2,4-dimethyl-cyclobutyl group, 3,3-dimethyl-cyclobutyl group, 1-n-propyl-cyclopropyl group, 2-n-propyl-cyclopropyl group, 1-i-propyl-cyclopropyl group, 2-i-propyl-cyclopropyl group, 1,2,2-trimethyl-cyclopropyl group, 1,2,3-trimethyl-cyclopropyl group, 2,2,3-trimethyl-cyclopropyl group, 1-ethyl-2-methyl-cyclopropyl group, 2-ethyl-1-methyl-cyclopropyl group, 2-ethyl-2-methyl-cyclopropyl group, and 2-ethyl-3-methyl-cyclopropyl group.

9. The resist underlayer film-forming composition according to claim 1, wherein the $C_{1-10}$ alkyl group of Y is selected from the group consisting of a methyl group, ethyl group, n-propyl group, i-propyl group, cyclopropyl group, n-butyl group, i-butyl group, s-butyl group, t-butyl group, cyclobutyl group, 1-methyl-cyclopropyl group, 2-methyl-cyclopropyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, cyclopentyl group, 1-methyl-cyclobutyl group, 2-methyl-cyclobutyl group, 3-methyl-cyclobutyl group, 1,2-dimethyl-cyclopropyl group, 2,3-dimethyl-cyclopropyl group, 1-ethyl-cyclopropyl group, 2-ethyl-cyclopropyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, 1-ethyl-2-methyl-n-propyl group, cyclohexyl group, 1-methyl-cyclopentyl group, 2-methyl-cyclopentyl group, 3-methyl-cyclopentyl group, 1-ethyl-cyclobutyl group, 2-ethyl-cyclobutyl group, 3-ethyl-cyclobutyl group, 1,2-dimethyl-cyclobutyl group, 1,3-dimethyl-cyclobutyl group, 2,2-dimethyl-cyclobutyl group, 2,3-dimethyl-cyclobutyl group, 2,4-dimethyl-cyclobutyl group, 3,3-dimethyl-cyclobutyl group, 1-n-propyl-cyclopropyl group, 2-n-propyl-cyclopropyl group, 1-i-propyl-cyclopropyl group, 2-i-propyl-cyclopropyl group, 1,2,2-trimethyl-cyclopropyl group, 1,2,3-trimethyl-cyclopropyl group, 2,2,3-trimethyl-cyclopropyl group, 1-ethyl-2-methyl-cyclopropyl group, 2-ethyl-1-methyl-cyclopropyl group, 2-ethyl-2-methyl-cyclopropyl group, and 2-ethyl-3-methyl-cyclopropyl group.

10. The resist underlayer film-forming composition according to claim 1, wherein the $C_{1-10}$ alkyl group of Y is selected from the group consisting of an ethyl group, n-propyl group, i-propyl group, cyclopropyl group, n-butyl group, i-butyl group, s-butyl group, t-butyl group, cyclobutyl group, 1-methyl-cyclopropyl group, 2-methyl-cyclopropyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, cyclopentyl group, 1-methyl-cyclobutyl group, 2-methyl-cyclobutyl group, 3-methyl-cyclobutyl group, 1,2-dimethyl-cyclopropyl group, 2,3-dimethyl-cyclopropyl group, 1-ethyl-cyclopropyl group, 2-ethyl-cyclopropyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, 1-ethyl-2-methyl-n-propyl group, cyclohexyl group, 1-methyl-cyclopentyl group, 2-methyl-cyclopentyl group, 3-methyl-cyclopentyl group, 1-ethyl-cyclobutyl group, 2-ethyl-cyclobutyl group, 3-ethyl-cyclobutyl group, 1,2-dimethyl-cyclobutyl group, 1,3-dimethyl-cyclobutyl group, 2,2-dimethyl-cyclobutyl group, 2,3-dimethyl-cyclobutyl group, 2,4-dimethyl-cyclobutyl group, 3,3-dimethyl-cyclobutyl group, 1-n-propyl-cyclopropyl group, 2-n-propyl-cyclopropyl group, 1-i-propyl-cyclopropyl group, 2-i-propyl-cyclopropyl group, 1,2,2-trimethyl-cyclopropyl group, 1,2,3-trimethyl-cyclopropyl group, 2,2,3-trimethyl-cyclopropyl group, 1-ethyl-2-methyl-cyclopropyl group, 2-ethyl-1-methyl-cyclopropyl group, 2-ethyl-2-methyl-cyclopropyl group, and 2-ethyl-3-methyl-cyclopropyl group.

11. A resist underlayer film-forming composition comprising:
a polymer (A) consisting of a unit structure of Formula (1) and a unit structure of Formula (2);
a crosslinkable compound (B) having at least two groups selected from blocked isocyanate groups, methylol group, or $C_{1-s}$ alkoxy methyl groups; and
a solvent (C), wherein
the polymer (A) is a polymer in which the unit structure of Formula (1) and the unit structure of Formula (2) are copolymerized in a mol % ratio of the unit structure of Formula (1): the unit structure of Formula (2)=25 to 60:75 to 40

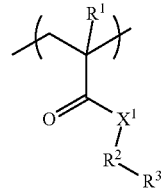

Formula (1)

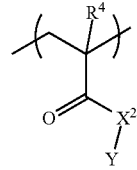

Formula (2)

where
each of $R^1$ and $R^4$ is a hydrogen atom or methyl group;
$X^1$ is an NH group;
$X^2$ is an oxygen atom;
$R^2$ is an benzene ring;
$R^3$ is a hydroxy group or a carboxy group; and
Y is an optionally substituted acyclic $C_{1-10}$ alkyl group.

* * * * *